United States Patent [19]

Vig et al.

[11] 4,125,086

[45] Nov. 14, 1978

[54] NOZZLE BEAM TYPE METAL VAPOR SOURCE

[75] Inventors: John R. Vig, Colts Neck; Erich Hafner, Tinton Falls; Ronald P. Andres, Princeton, all of N.J.

[73] Assignee: The United States of America as represented by the Secretary of the Army, Washington, D.C.

[21] Appl. No.: 757,261

[22] Filed: Jan. 6, 1977

[51] Int. Cl.² ............................................. C23C 13/08
[52] U.S. Cl. .................................... 118/49.1; 427/118
[58] Field of Search .................. 118/48, 49, 49.1, 49.5

[56] References Cited

U.S. PATENT DOCUMENTS

| | | | |
|---|---|---|---|
| 2,363,781 | 11/1944 | Ferguson | 118/48 UX |
| 2,734,478 | 2/1956 | Reynolds et al. | 118/49.1 |
| 3,271,561 | 9/1966 | Fielder et al. | 118/49.5 UX |
| 3,572,672 | 3/1971 | Harel | 118/48 X |
| 3,867,183 | 2/1975 | Cole | 118/49.5 X |
| 3,971,334 | 7/1976 | Pundsack | 118/49 X |
| 3,989,862 | 11/1976 | Butler et al. | 118/49.1 X |
| 4,050,408 | 9/1977 | Beucherie | 118/49.1 |

*Primary Examiner*—Wm. Carter Reynolds
*Attorney, Agent, or Firm*—Nathan Edelberg; Sheldon Kanars; Edward Goldberg

[57] ABSTRACT

A novel, high-flux source for use in the vapor deposition of electrode materials, such as gold, during the fabrication of precision quartz-crystal resonators, or the like. The design is based on the theory and technology of nozzle beams. The nozzle beam type source disclosed herein is conceived: (1) to permit large deposition rates with minimum wastage of electrode material; (2) to operate in high vacuum; (3) to emit vapor in a horizontal direction, thereby permitting the use of a pair of sources to plate both sides of a substrate simultaneously; and (4) to operate for extended periods of time without requiring frequent breaking of the vacuum in order to replenish the source. It is estimated that this design can operate at a deposition rate equal or above that of a conventional evaporation-type source with less than one percent of the wastage of electrode material experienced with a conventional source.

12 Claims, 5 Drawing Figures

NOZZLE BEAM TYPE METAL VAPOR SOURCE

GOVERNMENT LICENSE

The invention described herein may be manufactured and used by or for the Government for governmental purposes without the payment of any royalties thereon or therefor.

BACKGROUND OF THE INVENTION (1) Field of the Invention

Broadly speaking, this invention relates to vapor deposition. More particularly, in a preferred embodiment, this invention relates to a nozzle beam type metal vapor source for use in the vapor deposition of electrode materials, such as gold, during the fabrication of precision quartz-crystal resonators, or the like.

(2) Discussion of the Prior Art

A critical step in the fabrication of ultra high-precision quartz-crystal resonators is the vacuum deposition of the electrode material. In order to minimize stresses that could cause aging, it is customary for both sides of the resonator to be plated simultaneously and at equal rates so that the final thicknesses of the electrodes are approximately equal. In order to minimize aging due to mass transfer, the electrode material is of high purity and is deposited rapidly under high vacuum conditions so as to minimize sorption of contaminants.

These requirements place rather stringent performance requirements on the metal vapor source used in the vacuum plating operation. Ideally it should be capable of operation over a wide range of controlled deposition rates, should be compatible with high vacuum operation, should minimize wastage of expensive electrode material, such as gold, should not require frequent maintenance, and should permit simultaneous plating of both sides of a substrate.

Unfortunately, no metal vapor source satisfying all of these performance requirements was heretofore available.

SUMMARY OF THE INVENTION

As a solution to these and other problems, the instant invention uses nozzle beam techniques to develop a new vapor deposition source. This source is divided into two chambers interconnected by means of an aperture. The first of these chambers, the source chamber, is held at a high temperature so as to maintain the vapor pressure of the evaporant at a high value. The second chamber, the collimation chamber, is maintained near the melting point of the evaporant thereby maintaining a relatively low vapor pressure. Because of the pressure differential between the two chambers, a vapor flow is established through the source aperture. A portion of this flow passes through a collimation aperture and plates the substrate. By far the largest fraction of the flow, however, strikes the walls of the collimation chamber, condenses, and is recycled to the source chamber by means of a liquid transfer line. This recycling can take place continuously by maintaining the collimation chamber at slightly above the melting point, or intermittently, by maintaining the collimation chamber below the melting point and raising the temperature to above the melting point periodically to recycle the evaporant. The great advantage of such a design over conventional evaporation sources is that the major part of the evaporant flow not needed to plate the substrate is recycled and not wasted. This is very significant when the evaporant is a precious metal, such as gold.

The invention and its mode of operation will be more fully understood from the following detailed description, when taken with the appended drawings, in which:

DETAILED DESCRIPTION OF THE INVENTION

Figure 1:
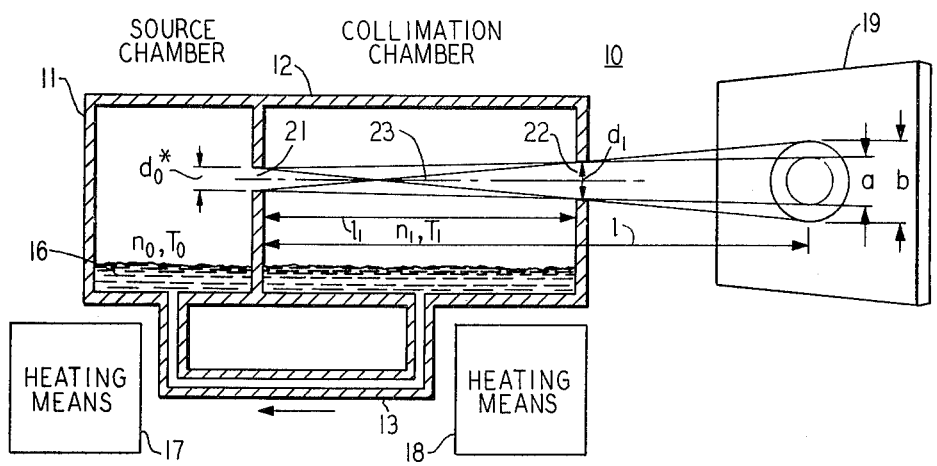
FIG. 1 is a cross-sectional view of an illustrative nozzle beam type metal vapor source, according to the invention.

As previously mentioned, the invention disclosed and claimed herein is based on the theory and technology of supersonic nozzle beams. In the manufacture of precision quartz resonators, the need for high deposition rates with minimum wastage of electrode materials indicates that the flow from the source chamber should be collimated and be at high density. Therefore what has come to be called a nozzle or free jet flow is required.

One of the outstanding problems in the design of the instant vapor deposition source was the problem of moving the liquid evaporant against a pressure differential from the collimation chamber to the source chamber.

The following discussion reviews and summarizes three approaches to the solution of this problem. First, the general design considerations for a nozzle beam type source are reviewed. Next, the results of experimental tests of three models are presented. Finally, the preferred embodiment is discussed in more detail.

GENERAL DESIGN CONSIDERATIONS

The flow distribution into a region of vacuum from a vapor source with an axisymmetric aperture can be theoretically predicted both in the limit of vanishing source density (i.e., large mean free path in the source relative to the diameter of the source aperture) and in the limit of high source density (i.e., small mean free path relative to aperture diameter).

In the first case we have the classical expressions for effusive flow:

$$f_o = (0.282) n_o \left(\frac{2kT_o}{m}\right)^{\frac{1}{2}} \left(\frac{\pi d_o^2}{4}\right) \quad (1)$$

and $$I(\theta = 0, l) = f_o \left(\frac{1}{\pi l^2}\right) \quad (2)$$

where $f_0$ = total source flow (molecules/sec)
$n_0$ = source density (molecules/cc)
$T_0$ = source temperature (° K.)
$k$ = Boltzmann's constant (erg/° K.)
$m$ = molecular weight of vapor (gm/molecule)

$d_0$ = source aperture diameter (cm)

$I(\theta=0, l)$ = centerline flux intensity (molecules/cm² sec)

$l$ = distance from source aperture (cm).

In this effusive limit the flux intensity, $I(\theta, l)$, varies as the cosine squared of the angle, $\theta$, measured with respect to the centerline of the flow. Thus, in the region about $\theta = 0$ the flux of molecules is: (1) practically constant with $\theta$, (2) proportional to the total source flow, $f_0$, and (3) inversely proportional to the distance, $l$, squared.

Work has been done to analyze the structure of the supersonic free jet flow that exists in the limit of high source density. Making use of these results yields simple expressions for total source flow and centerline intensity which have the form:

$$f_o = (0.513) \, n_o \left(\frac{2kT_o}{m}\right)^{\frac{1}{2}} \left(\frac{\pi d_o^2}{4}\right) \quad (3)$$

$$I(\theta = 0, l) = (1.85) f_o \left(\frac{1}{\pi l^2}\right) \quad (4)$$

The numerical constants in Eqns. (3) and (4) are for the case of an ideal monatomic vapor. The flux intensity, $I(\theta, l)$, varies in this high density limit as $$I(\theta, l) \simeq I(\theta = 0, l) \cos^2\left(\frac{\pi \theta}{2\phi}\right) \quad (5)$$

where $\phi = 1.36$ radians for the case of a monatomic vapor. Thus, in the region about $\theta = 0$ the flux of molecules is again: (1) practically constant with $\theta$, (2) proportional to the total source flow, $f_0$, and (3) inversely proportional to the distance, $l$, squared. In the high density or nozzle flow limit, however, the centerline flux intensity for a given source flow is nearly twice what it would be if effusive conditions obtained. Furthermore, the source flow and thereby the centerline intensity of a nozzle type source can be orders of magnitude greater than the effusive values for a given size aperture permitting much higher vapor deposition rates.

In most plating operations, the distance, $l$, is taken to be fairly large so as to minimize the effects of thermal radiation from the source. The actual solid angle about $\theta = 0$ that is subtended by the substrate is a small fraction of the total solid angle of the flow. Thus, only a small fraction of the total vapor passing through the source aperture is deposited on the substrate. The remainder of the source flow deposits onto various collimators or masks used to define the actual area on the substrate that is to be plated, and onto the walls of the vacuum system which leads to undesirable outgassing. While this material can, in principle, be recovered for eventual reuse, such recovery involves breaking open the vacuum system and substantial repurification. Ideally, one would like to continuously recycle the material that is not deposited on the substrate. It is this concept that forms the basis of the new source design disclosed herein.

FIG. 1 is a cross-sectional view of an illustrative vapor source 10. As shown, source 10 includes a source chamber 11 and a collimation chamber 12 which are interconnected by some means shown generally at 13. As will be explained, both source chamber 11 and collimation chamber 12 include liquid metal 16. Also shown generally in FIG. 1 are a heating means 17 and a heating means 18 for the source and collimation chambers, respectively. These may be the same heating means in some circumstances. Also shown generally is a workpiece 19 in the path of the vapor beam. This workpiece may be a substrate, a crystal resonator or the like. A source aperture 21 interconnects the source and collimation chambers and a collimation aperture 22 permits the vapor beam to impinge upon the workpiece.

As shown in FIG. 1, a directed beam of vapor molecules 23 is collimated from the total flow passing through the source aperture 21 and this collimated beam is used to plate substrate 19. The remaining portion of the vapor condenses on the walls of the chamber 12 containing the collimation aperture 22. Collimation chamber 12 is then either maintained at a temperature above the melting point of the material being used, so that the material continuously flows back into source chamber 11, or it is periodically heated to melt and recycle the condensate.

As long as $n_1$ is kept low enough so that the vapor molecules flowing through the source aperture are not appreciably scattered by the background density in the collimation chamber, the source flow will become free molecular at some point and the intensity distribution in the collimated beam will be roughly that from a virtual free molecular source situated at the position of the source aperture. In the case of effusive flow, the diameter of this virtual source, $d_0^*$, equals the actual aperture diameter, $d_0$. In the nozzle or high density limit, the diameter of the virtual source is a multiple, $\alpha$, of the actual aperture diameter, where $\alpha$ depends on the product $n_0 d_0$ (increasing slowly as $n_0 d_0$ increases). The parameter, $\alpha$, is always greater than unity but is typically less than four for flows in which nucleation and condensation of the vapor do not take place.

The intensity distribution from such a collimated free molecular source is shown schematically in FIG. 1. The intensity profile consists of two regions: (1) a central portion characterized by a diameter, $a$, in which the intensity is that of the uncollimated flow and (2) an annular region characterized by an outer diameter, $b$, in which the intensity falls to essentially zero. Straightforward geometrical considerations yield the following expressions for $a$ and $b$:

$$a = d_1 \frac{l}{l_1} + d_o^* \left(1 - \frac{l}{l_1}\right) \quad (6)$$

$$b = d_1 \frac{l}{l_1} + d_o^* \left(\frac{l}{l_1} - 1\right) \quad (7)$$

The only part of such a collimated beam that is useful for uniform plating of substrate 19 is the central portion. The diameter of this constant flux region can be designed, however, to be equal to or slightly greater than the diameter of the substrate area that is to be plated. The essential feature of such a collimated beam source is that only that fraction of the vapor flowing through the collimation aperture that is directed into the annular region with inner diameter $a$ and outer diameter $b$ need be wasted in contrast to the usual case of an uncollimated source when everything passing through the source aperture that is not directed onto the substrate is wasted. Even the small fraction of the flow that is wasted can be minimized by keeping $d_0^*/d_1$ small and/or by keeping $l/l_1$ close to unity.

Relevant physical data for gold are given in Table A below.

TABLE A

Physical Properties of Gold

| Vapor Pressure* | | | |
|---|---|---|---|
| T (°C) | T (°K) | p (torr) | n (molecules/cc) |
| 1316 | 1589 | $10^{-3}$ | $6.12 \times 10^{12}$ |
| 1465 | 1738 | $10^{-2}$ | $5.60 \times 10^{13}$ |
| 1646 | 1919 | $10^{-1}$ | $5.06 \times 10^{14}$ |
| 1869 | 2142 | 1 | $4.53 \times 10^{15}$ |
| 2154 | 2427 | 10 | $4.00 \times 10^{16}$ |
| 2363 | 2636 | 40 | $1.48 \times 10^{17}$ |
| 2521 | 2794 | 100 | $3.48 \times 10^{17}$ |
| 2807 | 3080 | 400 | $1.26 \times 10^{18}$ |

Melting Point*:
T = 1063° C
Specific gravity°:
T = 20° C 19.32 gm/cc (cubic lattice)
T = 1063° C 17.0 gm/cc (liquid)

Figure 2:
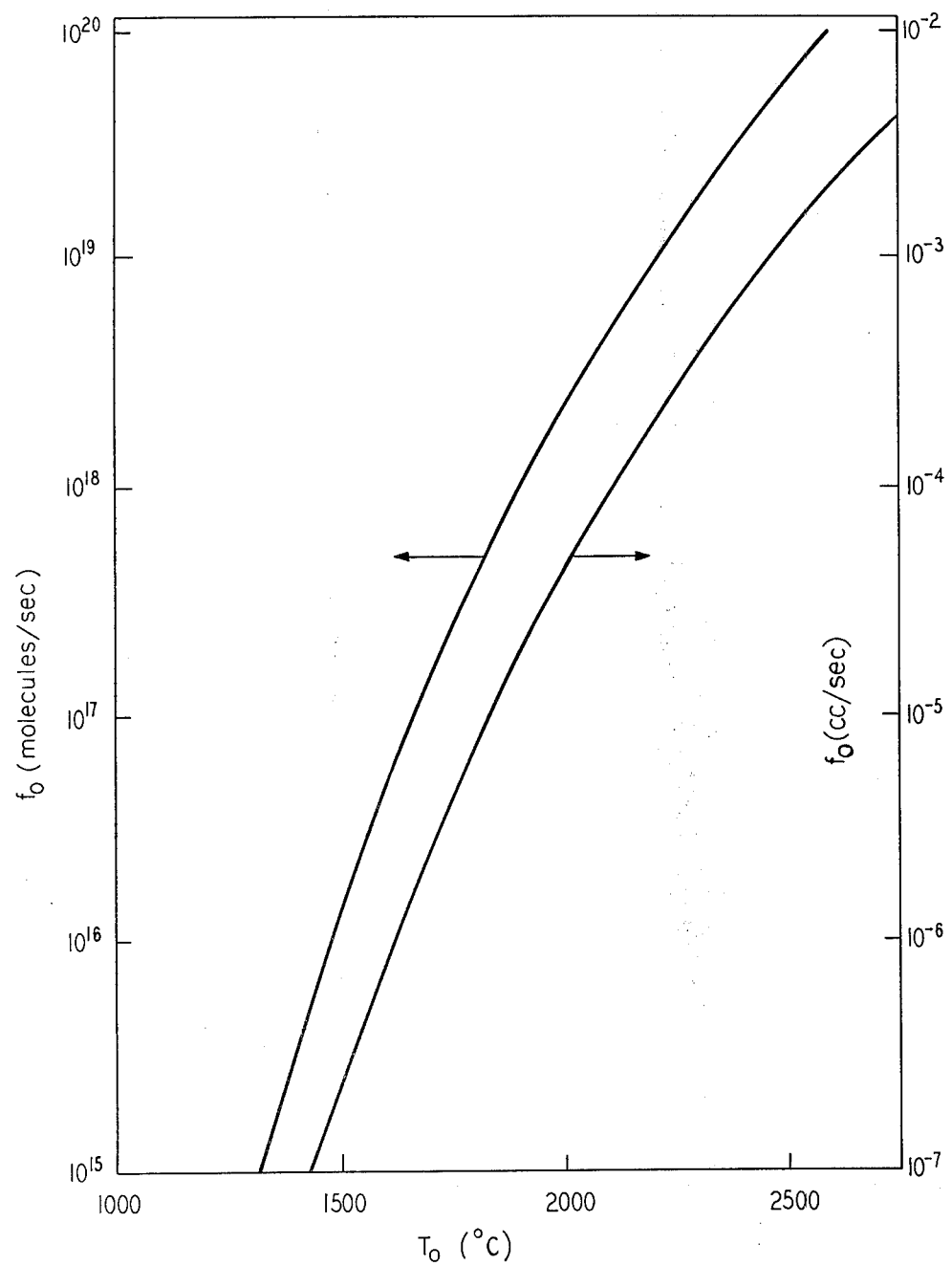
FIG. 2 is a graph depicting the vapor source flow for gold as a function of temperature.

Using the data shown in Table A and Eq. (3), it is possible to evaluate $f_0$ for a nozzle type gold vapor source. The results of such a calculation are plotted in FIG. 2 as a function of source temperature, $T_0$. A standard aperture diameter, $d_0$, of 1 mm was arbitrarily assumed in these calculations. The flow through any other aperture can be found by multiplying $f_0$ from FIG. 2 by the diameter squared in mm. Two sets of units in which to express $f_0$ are used. The left hand scale reads in molecules/second while the right hand scale reads in milliliters liquid gold/second.

The ideal centerline intensity of a nozzle beam type gold vapor source can now be obtained through use of Eq. (4) and values of $f_0$ obtained from FIG. 2. As an example of the order of magnitude of this flux, assume a standard arrangement in which $d_0$ 32 1 mm and $l = 10$ cm. Expressing the flux of gold vapor as an equivalent deposition rate, the deposition rate for this configuration in Å/sec equals $10^{-17}$ times $f_0$, expressed in mol/sec.

A rate of 1 Å/100 sec is achieved when $T_0 \approx 1300°$ C. A deposition rate of 10 Å/sec requires a source chamber temperature of 1900° C. High deposition rates, therefore, restrict the material of construction for a gold vapor source to one of the refractory metals.

SFL tungsten, formed by chemical vapor deposition, is ideal for this application. Practically any shape can be fabricated and this material has been operated continuously at temperatures above 2000° C. without significant grain growth. The purity of this material is excellent, and chemical interaction between Au and W is negligible.

The temperature of collimation chamber 12 for a gold vapor source is set by the melting point of gold, 1063° C. In this temperature range there are a number of oxide ceramics that can be used as materials of construction. In particular, high purity $Al_2O_3$ is very attractive as it exhibits negligible chemical interaction with Au, is an electrical insulator, is easily fabricated into practically any shape, is tolerant of thermal shock, is an excellent vacuum material, and is inexpensive. Many standard $Al_2O_3$ products are commercially available. It is also possible to obtain commercially green $Al_2O_3$ which can be easily machined and then fired.

The easiest way to heat in a controlled fashion a refractory metal object is to use electrical resistance heating. To that end, heating means 17 and 18 in FIG. 1 may both comprise resistance heating elements associated with their corresponding chambers. Of course, other heating sources may also be employed.

Taking the heating source to be a constraint on any optimum design yields a tubular shape for the source chamber and leads naturally to the three illustrative embodiments of the invention to be discussed below.

Figure 3:
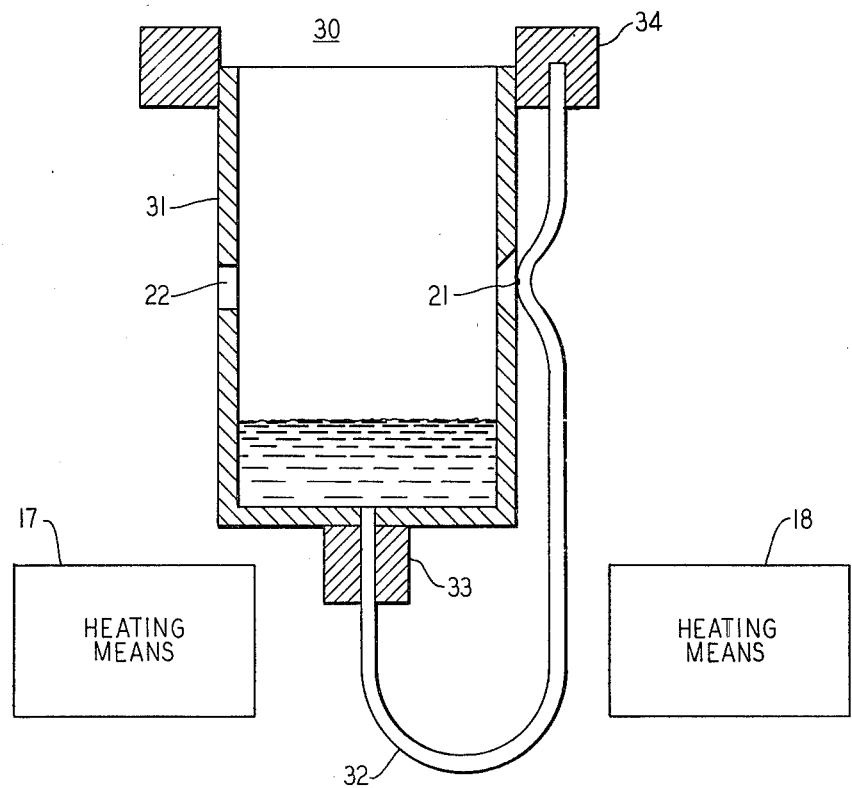
FIG. 3 is a cross-sectional view of a first, illustrative collimation chamber for use in the apparatus disclosed in FIG. 1.

As shown in FIG. 3, the first illustrative embodiment of the invention 30 was designed for operation within an existing vacuum system and was designed to use a standard $Al_2O_3$ crucible 31 as the collimation chamber having a collimation aperture 22 in one wall and a vapor deposited tungsten tube 32 as the source chamber. This design incorporates the use of a liquid head or pool in the collimation chamber 31 to transfer gold into the source chamber 32.

The tungsten tube 32 is retained to the bottom of crucible 31 by means of a molybdenum clamp 33. The upper end of tube 32 extends substantially parallel to the crucible wall and is retained by means of a stainless steel clamp 34. Typical dimensions for the source aperture 21 within an inward bend in tube 32 and the diametrically opposed collimation aperture 22 are 0.040 inch and 0.250 inch respectively. Another aperture is located in a wall of crucible 31 adjacent source aperture 21. The collimation chamber itself is typically 3 inches tall with an inner diameter of 1¾ inches and an outer diameter of 2 inches. The tube 32 is curved at the bottom end and extends about 1½ inches below the bottom surface of chamber 31. These dimensions are not critical, however.

The vapor source shown in FIG. 3 is not the preferred embodiment because of the extremely high cost of fabricated tungsten parts and the non-trivial problem of fabricating the curved tungsten tube.

Experiments in which standard $Al_2O_3$ crucibles of the general dimensions given for the chamber shown in FIG. 3 were heated from the bottom by means of a resistively heated element pointed out another drawback to this first embodiment. Application of heat to only the bottom of the crucible yielded large temperature differences between the top and the bottom of the crucible. Difficulties in obtaining suitable curved tungsten tubes and the problem of maintaining a uniform temperature for a crucible heated from the bottom alone led to the design of the second illustrative vapor source shown in FIG. 4. This design makes use of green alumina which can be easily machined. The only disadvantage of this material is that there is appreciable shrinkage when the object is fired, and the shrinkage factor must be taken into account.

As shown, this second illustrative vapor source 40 comprises a cylindrical $Al_2O_3$ crucible 41 forming a collimation chamber having an enlarged bottom portion 42. A tungsten rod 43 extends downwardly into the crucible and a tungsten tube 44 forming a source chamber having a closed upper end 46 extends parallel to the major axis of the crucible through a circumferential lip 47 into the bottom 42 of crucible 41. A very small source aperture 21, illustratively 0.040 inch in diameter, in the tube 44 coincides with an entrance aperture 48 in the wall of crucible 41, while an exit collimation aperture 22 is diametrically opposed in the other wall of crucible 41 and aligned with aperture 21.

Illustrative dimensions for crucible 41 (unfired green alumina) are approximately 2¼ inches outer diameter and 1¾ inches inner diameter for the bottom portion 42 of the crucible and ⅞ inch inner diameter and 1⅜ inches outer diameter for the main portion of the crucible. The overall height of the crucible is about 2¼ inches with the lip 47 being about ¾ inch from the bottom of the crucible.

The second embodiment of the invention incorporates a machined groove 49 on the outside of the crucible. Tungsten wire (0.015 inch diam.) may be wound in this groove and used as heating means 18 to electrically heat the crucible. This heating technique proved to be very successful and was improved in later embodiments by transforming the groove into one having a flat cross section in which 1/16 inch wide by 0.005 inch thick tantalum ribbon could wound. The increased contact area in this latter design produces a more uniform heater temperature and better heat transfer to the crucible.

Figure 4:
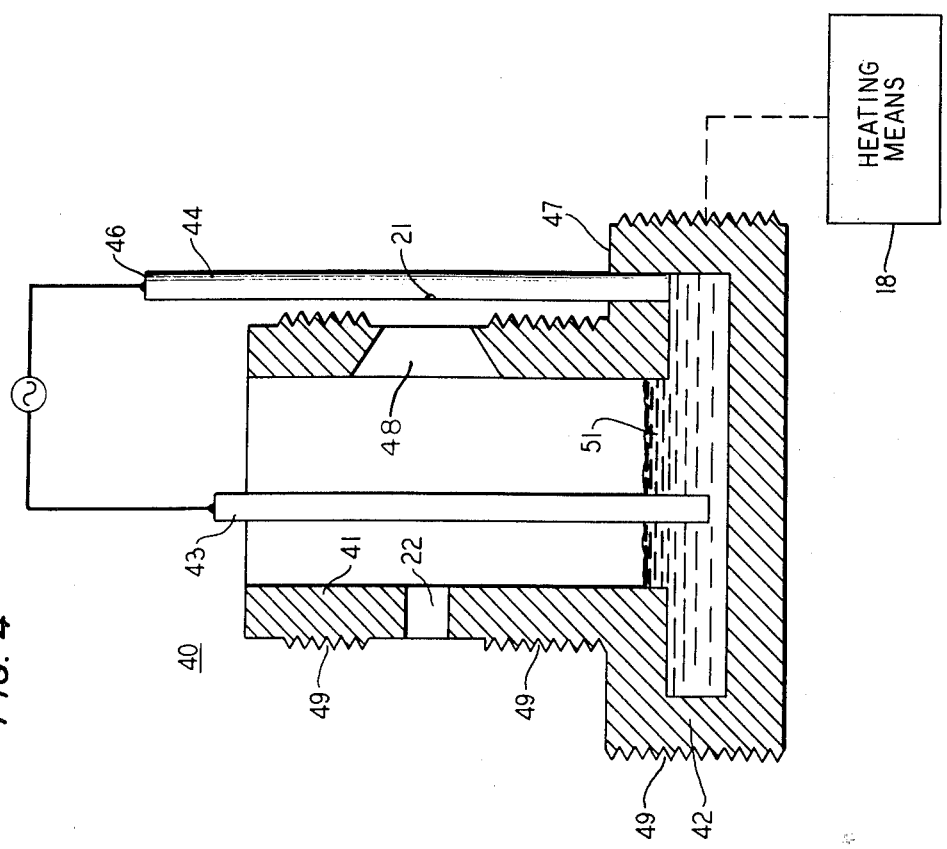
FIG. 4 is a cross-sectional view of a second, illustrative collimation chamber.

The vapor source as shown in FIG. 4 was constructed and assembled along with suitable radiation shields and current leads. The source tube 44 that was used for simulated testing was a standard ⅛ inch O.D. tantalum tube with a wall thickness of 0.010 inch. Electrical current to heat the source tube was supplied to this tube by means of a stainless steel clamp (not shown) connected to the upper end of the tube and by means of a ⅛ inch O.D. tungsten rod electrode 43 immersed into the pool of liquid metal 51 at the bottom of the crucible. The pool provides communication between the source tube 44 and bottom of crucible 41. Copper was used as the evaporant in all the experiments, rather than gold, due to its much lower cost.

Several experiments were run with the vapor source shown in FIG. 4 to test its performance. These runs pointed up two problem areas. First, the copper exhibited a relatively large contact angle with the Al₂O₃ which made it impossible to force liquid Cu into the region around the bottom of the Ta tube. This may, of course, be remedied by increasing the dimensions of the entire crucible. A more serious problem, however, involved the joint between the Ta tube and the Al₂O₃ crucible. After several runs the tube became embrittled at this joint and failed. In the experimental embodiment, the joint was a force fit at room temperature. Due to the difference in thermal expansion of Ta and Al₂O₃, the tube was constricted at its operating temperature and this may have caused the failure. Whatever the reason, when the crucible cracked during an attempt to remove the broken Ta tube, it was decided to modify the source design once more to that shown in FIG. 5, the third and preferred embodiment of the invention.

Figure 5:
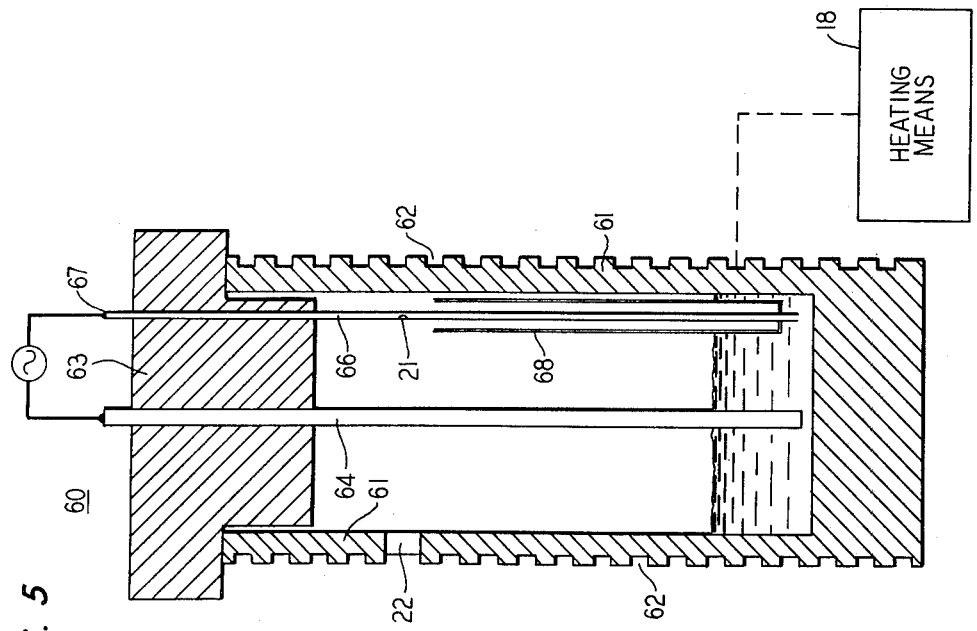
FIG. 5 is a cross-sectional view of a third, illustrative collimation chamber.

As shown in FIG. 5, the design of this third embodiment eliminates all metal-ceramic joints and has the decided advantage of a simplified crucible design which permits extraction of the metal charge as a solid block, if the need should ever arise. More specifically, vapor source 60 comprises an elongated, cylindrical Al₂O₃ crucible 61 having grooves 62 of flat cross-section cut in the outer surface thereof. The upper end of the crucible is sealed closed with an Al₂O₃ cap 63 through which pass a solid tungsten rod 64 and a tungsten tube 66 closed at the upper end 67 thereof. The bottom end of the tube 66 extends through the closed bottom of a second hollow cylindrical tungsten tube 68 of larger diameter and open at the opposite end. Source tube 66 is heated by electrical current connected between tube 66 and rod 64 through the liquid pool, such as in FIG. 4. The pool also provides communication between the source tube 66 and the bottom of the crucible.

A source aperture 21 in tube 66, illustratively 0.020 inch in diameter, aligns with collimation aperture 22 in the opposite wall of crucible 61. The outer diameter of crucible 61 is about 2½ inches and the overall length is about 6 inches. Tube 68 is about 3 inches long and the top thereof is about ¼ inch below aperture 21. There is about ¼ inch clearance between the bottom of tube 68 and the bottom of crucible 61. Electrical current is applied to the tube 66 and rod 64 and through the liquid metal, as in the embodiment of FIG. 4.

The vapor source shown in FIG. 5 was built and tested with copper as the evaporant. Several substitutions as to materials of construction were also necessitated by considerations of availability and cost. A simulation of this design was carried out using a 1/16 inch O.D. tantalum source tube 66 and a ¼ inch alumina shield 68. The alumina was obtained with one closed end and was drilled at the bottom to just permit the tantalum tube 66 to pass therethrough. This combination was then placed in a crucible similar in shape to that shown in FIG. 5 but constructed of lava rather than alumina. This source was run and after several attempts produced a directed beam that appeared to come from a virtual point source 21 collimated by collimation aperture 22. As before, embrittlement occurred at the metal-ceramic joint, which eventually caused tube failure. However, this will not occur in the actual source shown in FIG. 5.

Several comments on the design of the vapor source shown in FIG. 5 appear in order.

1. The choice of a 1/16 inch O.D. source tube 66 was necessitated by the lack of good temperature control on the collimation chamber 61. When a ⅛ inch O.D. source tube was used, the heat conducted from the source tube to the copper in the crucible raised its temperature and thereby its vapor pressure causing scattering of the nozzle beam. It may be that this small a tube is optimum because it effectively uncouples the temperature of the crucible from that of the high temperature source. However, for long life, high intensity and reliability, a larger diameter source tube may be preferable. The actual size employed will depend on the particular application in which the source is used.

Whatever size source tube is used, a thermocouple should be placed inside a closed end alumina tube and immersed in the liquid metal to monitor this temperature.

2. The position of the source aperture 21 is very critical with such a directed beam, and some suitable provision should be made to hold the high temperature source tube in place so that the source aperture 21 does not move around.

3. An Al₂O₃ insert or some suitable shape should be placed in the bottom of crucible 61 to displace some of this volume. It is important that there be a large liquid head to drive the evaporant up into the source tube, but if too large a cylindrical cavity is used this will lead to too large a metal inventory, undesirable if the metal is gold or some other precious metal.

4. With tantalum source tubes and a copper evaporant, difficulty was experienced in getting the liquid metal to flow into the tube. If this difficulty was due to surface tension effects, it should be minimal in a W—Au system. However, a solution that proved effective with the Ta—Cu system was to place a small amount of Cu wire inside the Ta tube initially. After this was done, no further trouble was observed. It appears that there was some sort of initial resistance to the flow that was eliminated by this procedure.

5. Because of the large size of the collimation crucible and its relatively high temperature, it is advisable to provide thermal radiation shielding around this chamber. Advantageously, the entire assembly may be surrounded by a cooled jacket if feasible. The reason for this is that it is desirable to collimate the beam as close to the substrate as possible, but a large radiation flux from the collimation chamber will tend to raise the temperature of the substrate which might damage the same under some circumstances.

6. The dimensions of the collimation chamber shown in FIG. 5 were arrived at by assuming that the substrate is to be located at a distance of approximately 20 cm from the source aperture and has a diameter of about 2.5 cm. Under different situations, the size of the collimating aperture and/or the distance between the nozzle and the collimator can be altered, after the teaching of the discussion in the section on general design considerations, to obtain an optimum intensity profile at the substrate.

One skilled in the art may make various changes and substitutions to the arrangement of parts shown without departing from the spirit and scope of the invention. For example, one need not restrict the structure to a single collimation aperture. By using a single source and a plurality of collimation apertures, a plurality of substrates may be plated simultaneously. Also, it is stressed that the many physical dimensions shown are illustrative only and are not intended to be limiting. Further, the materials used for the crucibles, rods and tubes are likewise merely illustrative and are not intended to limit the scope of the claimed invention.

What is claimed is:

1. Apparatus for generating a beam of metal vapor to plate a workpiece, which comprises:
    a source chamber for containing metal to be vaporized into a beam;
    a collimation chamber having a first aperture through which the metal vapor beam passes to impinge upon said workpiece, said source chamber having a small source aperture communicating with said collimation chamber, said apertures being aligned to direct said beam at said workpiece;
    means for heating said source chamber to a temperature sufficient to vaporize said metal and to maintain a high metal vapor pressure within said source chamber;
    means for heating said collimation chamber to a temperature which at least equals the melting point of said metal, thereby maintaining a relatively low metal vapor pressure in said collimation chamber, the pressure differential between said source and collimation chambers creating a supersonic vapor flow through said source aperture, a substantial fraction of said flow striking the walls of said collimation chamber and condensing to liquid metal, the remaining fraction of said flow passing through said first aperture to impinge upon said workpiece; and
    means for recirculating the liquid metal from the collimation chamber to the source chamber against said pressure differential whereat said liquid metal is revaporized, said liquid metal forming a pool communicating with said collimation and source chambers.

2. The apparatus according to claim 1 wherein said collimation chamber comprises a hollow cylindrical crucible having a second aperture in the wall opposite said first aperture, said source chamber comprises a metal tube having a curved bottom end communicating through the bottom of said crucible with the liquid metal contained therein, the other end of said tube extending substantially parallel to the wall of said crucible and having an inward bend therein which aligns with the second aperture in the wall of said crucible, said tube having an aperture therein at said inward bend for directing a metal vapor flow through the second aperture in the wall of said crucible, said first aperture of the collimation chamber aligning with and diametrically opposed to the second aperture.

3. The apparatus according to claim 2 wherein said tube is comprised of tungsten.

4. The apparatus according to claim 2 wherein said collimation chamber heating means comprises an electrical resistance heating means associated with said crucible.

5. The apparatus according to claim 1 wherein said collimation chamber comprises an elongated, hollow, cylindrical crucible having an upper portion with a second aperture and an enlarged bottom portion forming a circumferential lip with the upper portion; said source chamber comprises a hollow, cylindrical tube parallel to the major axis of said cylindrical crucible, said tube communicating through said lip with the enlarged bottom portion of the crucible and being closed at the other end, said tube further having said source aperture therein aligning with said second aperture in the wall of said crucible for directing a metal vapor flow through said second aperture, said first aperture of the collimation chamber being diametrically opposed to and aligning with the second aperture, said apparatus further comprising a rod which extends downwards into said crucible for engagement with the liquid metal contained therein.

6. The apparatus according to claim 5 wherein said tube is comprised of tantalum and said rod is comprised of tungsten.

7. The apparatus according to claim 5 wherein said source chamber heating means comprises means for applying an electrical potential across said rod and said tube thereby to create an electrical heating current in a path that includes the liquid metal.

8. The apparatus according to claim 5 wherein said collimation chamber heating means comprises an electrical resistance heating means and said crucible includes circumferential grooves therein for receiving said resistance heating means.

9. The apparatus according to claim 1 wherein said collimation chamber comprises an elongated, hollow, cylindrical crucible including removable means for sealing the upper end thereof, said crucible having said first collimation chamber aperture in the wall therof; said source chamber comprises a downwardly extending, hollow, metal tube which passes through said sealing means into said crucible, said tube being sealed at its upper end; said apparatus further including:
    a metal rod extending through said sealing means for engagement with the liquid metal in said crucible; and
    an elongated, hollow, cylindrical, metal shield positioned within said crucible, said shield having an open upper end to receive said downwardly extending metal tube, and a closed bottom end through which said tube passes to communicate with the liquid metal in the bottom of the crucible, said metal tube having an aperture therein aligning with said first aperture in said crucible for directing a beam of metal vapor onto said workpiece through said first aperture, said metal shield extending upwardly to a point just below said metal tube aperture.

10. The apparatus according to claim 9 wherein said rod, tube and shield are all comprised of tungsten.

11. The apparatus according to claim 9 wherein said source chamber heating means comprises means for applying an electrical potential across said rod and said tube thereby to cause a heating current flow in a path that includes said liquid metal.

12. The apparatus according to claim 9 wherein said collimation chamber heating means comprises an electrical resistance heating means and said crucible includes circumferential grooves therein for receiving said resistance heating means.

* * * * *